United States Patent [19]

Davies

[11] Patent Number: 5,368,980
[45] Date of Patent: Nov. 29, 1994

[54] PROCESS OF DEVELOPING A DIFFUSION TRANSFER PRINTING PLATE

[75] Inventor: Paul Davies, Shoreview, Minn.

[73] Assignee: Minnesota Mining and Manufacturing Company, St. Paul, Minn.

[21] Appl. No.: 142,229

[22] Filed: Oct. 25, 1993

[51] Int. Cl.$^5$ ................................................ G03C 5/54
[52] U.S. Cl. .................................... 430/204; 430/249
[58] Field of Search ................................ 430/204, 249

[56] References Cited

U.S. PATENT DOCUMENTS

| | | | |
|---|---|---|---|
| 3,615,444 | 10/1971 | Ohkubo et al. | 96/33 |
| 3,728,114 | 4/1973 | Futaki et al. | 430/204 |
| 3,776,728 | 12/1973 | Suzuki et al. | 430/204 |
| 4,147,543 | 4/1979 | Kubotera et al. | 430/204 |
| 4,160,670 | 7/1979 | Tsubai et al. | 430/204 |
| 4,298,673 | 11/1981 | Kubotera et al. | 430/204 |
| 4,361,635 | 11/1982 | Kinderman et al. | 430/14 |
| 4,798,779 | 1/1989 | Idota et al. | 430/202 |
| 4,810,623 | 3/1989 | Kokelenberg et al. | 430/448 |
| 5,059,508 | 10/1991 | Vaes et al. | 430/204 |

FOREIGN PATENT DOCUMENTS

| | | | |
|---|---|---|---|
| 0398435A1 | 5/1990 | European Pat. Off. | G03C 8/36 |
| 0503164A1 | 3/1991 | European Pat. Off. | G03C 8/36 |
| 0549830A1 | 12/1991 | European Pat. Off. | G03F 7/07 |
| 56-2946 | 1/1981 | Japan . | |
| 61-23547 | 6/1986 | Japan . | |
| 61-45227 | 10/1986 | Japan . | |
| 63-36662 | 7/1988 | Japan . | |
| 2-7456 | 2/1990 | Japan . | |
| 2-27661 | 6/1990 | Japan . | |
| 3-45375 | 7/1991 | Japan . | |
| 3-45376 | 7/1991 | Japan . | |
| 3-45377 | 7/1991 | Japan . | |
| 3-45378 | 7/1991 | Japan . | |
| 4-18295 | 3/1992 | Japan . | |
| 4-44739 | 7/1992 | Japan | G03F 7/07 |
| 4-45819 | 7/1992 | Japan . | |
| 4-47300 | 8/1992 | Japan . | |
| 4-61347 | 9/1992 | Japan . | |
| 1241662 | 8/1971 | United Kingdom | G03F 7/06 |
| 2081465A | 7/1981 | United Kingdom | G03C 5/54 |

OTHER PUBLICATIONS

*The Theory Of The Photographic Process* Fourth Edition, MacMillan Pub. Co., N.Y.

Primary Examiner—Richard L. Schilling
Attorney, Agent, or Firm—Gary L. Griswold; Walter N. Kirn; Mark A. Litman

[57] ABSTRACT

A method of making a lithographic printing plate that comprises of:

(a) imagewise exposing a light sensitive material comprising of a support, at least a negative working light sensitive silver halide layer and a surface physical development nucleating layer, said material containing a silver halide black-and-white photographic developing agent and an electron transfer agent in one or more layers;

(b) processing said printing plate in a diffusion-transfer alkaline activator solution to provide a transferred oleophilic silver complex and a non-transferred black image in the nucleating layer;

(c) said diffusion-transfer alkaline activator comprising at least one compound of the following structure:

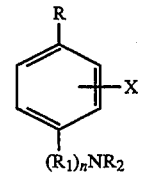

where
  R is a hydrogen, hydroxy or amine group,
  $R_1$, may be a methine group,
  n is zero or one,
  $R_2$ is hydrogen, a lower alkyl, alkoxy, carboxyl, or forms a pyrazolidone group with the nitrogen atom,
  X may be one or more amine, hydroxy, lower alkyl, alkoxy or carboxyl substituent groups.

6 Claims, No Drawings

PROCESS OF DEVELOPING A DIFFUSION TRANSFER PRINTING PLATE

A method for making a lithographic printing plate that comprises imagewise exposing a developer-incorporated, light-sensitive material comprising a support, and at least a negative silver halide emulsion layer and a surface physical development nucleating layer on said support, and processing said construction in a silver complex diffusion-transfer alkaline activator containing an aminophenol.

BACKGROUND OF THE INVENTION

1. Field of the Invention

This invention relates to a method of making a lithographic printing plate by the silver complex diffusion transfer process. In particular, this invention relates to a method of preventing developer mottle, toning and lack of transfer density when processing developer-incorporated plate material in fresh alkaline activator solutions.

2. Background of the Art

As described in various embodiments, e.g., U.S. Pat. Nos. 3,728,114, 4,160,670 and 4,361,635, diffusion-transfer imaging systems can provide a lithographic printing plate due to the oleophilic nature of the complexed silver in the receptor layer and the hydrophilic developed silver image in the emulsion layer. However, a very rapid development process is required to reduce exposed areas into nondiffusing silver images before the silver halide solvent can take effect. The greater the differentiation between the (unexposed) complexed silver and the (exposed) developed image area, the better the printing quality will be. However, the high pH required to produce such an active chemistry causes rapid oxidation of the developing agents. One method of overcoming this limitation is to incorporate the developing agents into the light sensitive medium and processing in an alkaline solution.

With respect to diffusion-transfer systems, in particular, a monosheet lithographic plate as described in U.S. Pat. No. 4,361,635 and EP 375,159, disclose a surface which consists of an extremely thin layer of physical developing nuclei such as palladium sol or salt thereof. If developing agents are incorporated into such a construction and the plate is machine processed in fresh alkaline activator, there is insufficient and uneven transfer development. The result is an oleophilic image that lacks printing endurance and has an undesirable bronze rather than shiny silver tone. Without wishing to be limited to any one particular theory, but it is assumed that these defects arise from the incorporated developer being eluted from the surface nucleating layer by the recirculating action of the processor before transfer development is complete.

According to G. M. Haist, *Modern Photographic Processing*, Vol. 2, John Wiley & Sons, 1979, p. 284–88, activators often require small quantities of developing agents in order to establish development equilibrium when machine processed. An example given by Haist is a 1g/liter hydroquinone activator for obtaining optimum gamma in a fine-grain positive film.

U.S. Pat. No. 4,798,779 shows the use of aminophenols in silver salt diffusion transfer imaging systems. The aminophenol improves the black tone of the image.

G.B. 1,241,662 describes a developer incorporated diffusion-transfer plate. In some cases the patent specifically excludes any developing agents from the alkaline activator solution.

U.S. Pat. No. 4,298,673 describes making a lithographic printing plate using a diffusion-transfer developer containing a p-dihydroxybenzene and either a 3-pyrazolidone or an aminophenol.

U.S. Pat. No. 4,810,623 defines an "essentially developer-free" activator as one containing less than 0.014 mol./liter of developing agent. It specifically excludes diffusion-transfer systems.

E.P. 503,164 claims the use of a fresh alkaline activator solution containing between $10^{-4}$ to $5\times10^{-2}$ mol./liter of p-dihydroxybenzene derivative(s) to make a printing plate by the silver halide diffusion-transfer process.

However, in the case of E.P. 503,164, the consistency of transferred image may be short lived due to the rapid oxidation of hydroquinone. While increasing the level of p-dihydroxybenzenes may overcome this limitation, it will result in a more intensely colored solution and increased precipitation of humic acids.

SUMMARY OF INVENTION

The use of aminophenols in diffusion-transfer activator solutions provides a lower rate of oxidation in the solutions, which in turn means less color change and reduced precipitation of humic acids. Furthermore, aminophenols are an improved class of developing agents in fresh diffusion-transfer activators for lithographic plate applications.

DESCRIPTION OF THE INVENTION

This invention provides a method for making a lithographic printing plate of consistent quality using fresh alkaline activator solution. The process is accomplished by imagewise exposing a single sheet lithographic plate material consisting of a flexible support, at least a light sensitive silver halide layer and a physical development nucleating surface layer, and processing said plate material in an aminophenol containing diffusion-transfer activator solution, wherein imaged portions develop out as hydrophilic areas and oleophilic areas represent the non-imaged portions of said plate material.

In the present invention a single sheet construction of a support, on which an antihalation layer, an emulsion layer and finally a physical nucleating receptor layers are provided. Developing agents may be incorporated into any layer of this construction, though preferably in the antihalation layer. Following imagewise exposure it is processed in a diffusion-transfer alkaline activator. The exposed area develops out as a black silver image, while the unexposed silver halide subsequently diffuses through to the receptor element. The physical developing nuclei in the receptor layer reduces the silver halide to a metallic silver complex in the presence of a toning agent.

The flexible support according to this invention may be paper, (X-olefin polymer coated paper, films such as cellulose acetate, polypropylene, polystyrene, polycarbonate, polyester, polyvinyl acetal, polyethylene terephthalate, composite films, metals, metalised paper, or metal/paper laminates.

It is preferred to have a backside coating and at least an undercoat layer on the image-bearing side of said support, consisting of a hydrophilic polymer, which may also contain dyes or pigments to provide antihalation properties or impart certain physical characteristics such as low curl or colored appearance. The preferred hydrophilic polymer is gelatin, especially an inert deionized ossein type gelatin, and may be combined with hydrophilic binders such as starch, albumin, sodium alginate, hydroxyalkylcellulose, gum arabic, polyvinyl alcohol, polyvinyl pyrrolidone, carboxymethylcellulose, polyacrylamide or copolymers of styrene-maleic anhydride or polyvinyl methyl ether-maleic anhydride. The preferred antihalation pigment in the undercoat layer is carbon black though other dyes or pigments that absorb at the wavelength of the imaging light source may also be used.

Included in both the back-side and face-side underlayer may be coating aids such as surfactants, antistatic agents, matting agents, anti-tacking agents and hardening compounds for said hydrophilic binder.

Examples of surfactants include non-ionic surface active agents such as saponin, alkylene oxide derivatives, glycidol derivatives, fatty acid esters of polyhydric alcohols and alkyl esters of sugars, anionic surface active agents having an acidic group such as carboxyl, sulfo, phospho, sulfuric acid ester or phosphoric acid ester group, cationic surface active agents such as amino acids, aminoallkylsulfonic acids, aminosulfonic or phosphoric acid esters, alkylbetaines, amine oxides, fluorinated compounds, alkylamine salts, aliphatic or aromatic quaternary ammonium or phosphoric salts, heterocyclic quaternary ammonium and aliphatic or heterocyclic ring-containing phosphonium or sulfonium salts. The matting agent may include silica, colloidal silica, polymeric particles, glass powder or starch powder.

The hardening agents may include organic and/or inorganic compounds for example: chromium or aluminum salts, aldehydes, N-methylol compounds, dioxane derivatives, active vinyl compounds such as triacryloyl-hexahydro-s-triazines or vinylsulfones, active halogen compounds such as dichlorohydroxy-s-triazines, or mucohalogenic acids.

Such examples as described above may also be utilized in the light sensitive silver halide layer.

The silver halide used in this invention may consist of silver chloride, silver bromide, silver iodide, silver chlorobromide, silver bromoiodide or mixtures thereof and mixtures of various crystalline forms (e.g., cubic, tabular, etc.). Included in the silver halide may dopants from Group VIII of the Periodic Table, such as rhodium, ruthenium, iridium or mixtures thereof in the range $10^{-3}$ to $10^{-8}$ mole per mole of silver. The crystalline form of the sliver halide may be monodispersed or polydispersed and may also be of the core-shell or tablet type grains of from about 0.05 to 3 microns. The preferred embodiment of the present invention is a 0.2–0.3 micron ruthenium-iridium doped monodispersed silver chlorobromide emulsion containing at least 60% chloride.

These emulsions can be chemically sensitized by known methods, for example alone or in combination with: sulfur sensitization as described in U.S. Pat. Nos. 1,574,944, 2,278,947, 2,410,689, 3,189,458 or 3,501,313; gold sensitization as disclosed in U.S. Pat. Nos. 2,597,856, 2,597,915 or 2,399,083; reduction sensitization as described in U.S. Pat. No. 2,518,698, 2,521,925, 2,487,850 or 2,6694,637. The photographic emulsions used in the present invention may be further sensitized with quaternary ammonium or phosphonium salts, thioether compounds, polyethylene oxide derivatives or diketones as disclosed in U.S. Pat. Nos. 2,708,162, 3,046,132, 3,046,133, 3,046,134 or 3,046,135.

The photographic emulsion of the present invention may be spectrally sensitized to any wavelength in either the visible or infrared portion of the electromagnetic spectrum by methods known to those skilled in the art. Examples of spectral sensitizers used in the present invention may include cyanine, merocyanine or other sensitizing dyes.

The photographic emulsion layer may contain various compounds to prevent fogging of the light sensitive material of the present invention during preparation, storage or during processing. Such antifoggants and stabilizers may include azoles such as benzothiazolium salts, nitroindazoles, triazoles and benzimidazoles; heterocyclic mercapto compounds such as mercaptothiazoles, mercaptobenzothiazoles, mercaptobenzimidazoles, mercaptothiadiazoles or mercaptopyrimidines; thioketo compounds such as oxazolinthion; azaindenes such as tetraazindenes; benzenethiosulfonic acids or benzenesufinic acids.

The receptor layer provided above said emulsion layer contains physical development nuclei, which may be fine particles of metals such as silver, bismuth, antimony, cadmium, cobalt, lead, nickel, palladium, rhodium, gold, platinum, iron, etc., or sulfides, polysulfides or selenides of these metals, or mixtures thereof. The receptor layer may also contain adjuvants such as binders, coating aids, antistatic compounds, hardeners, etc. similar to the examples described in the other coated layers.

As mentioned previously, to differentiate the oleophilic from hydrophilic areas of the plate material, the diffusion-transfer process requires an extremely active chemistry that can fully develop out the imaged areas before the silver halide solvent can take effect. One way to increase activity is to increase the alkalinity of the chemistry. However, under such conditions, the developing agent and electron transfer agent may undergo rapid oxidation, thereby adversely affecting image quality and significantly reducing chemistry life. These limitations may be overcome by incorporating the developing agents into the lithographic plate, and subsequently processing in an alkaline activator solution. Developing agents may include polyhydroxybenzenes, such as hydroquinone and electron transfer agents such as 1-phenyl-3-pyrazolidone. As will be demonstrated, a fresh alkaline activator type system does not guarantee consistent image quality, but may be improved upon by the present invention.

The aminophenols of the present invention may be generally represented as a compound having a central nucleus of the formulae:

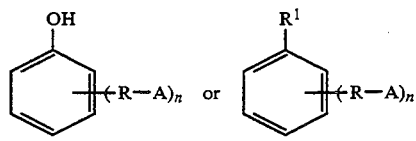

wherein R is a bond (i.e., directly from A to the phenol ring) or

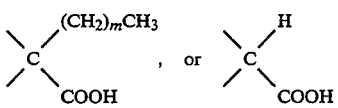

$R^1$ is H, hydroxy or amine group, and A is

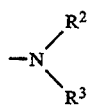

wherein n is 1 or 2 or 3,
m is 0 or 1 to 3, and
$R^2$ and $R^3$ are independently hydrogen, carboxyl, alkoxy or alkyl group (of 1 to 6 carbon atoms) or aryl group (preferably phenyl group) of up to 12 carbon atoms. $R^2$ and $R^3$ may also be fused with the included nitrogen atom to form a pyrazolidone group. The phenol nucleus may have additional substitution thereon such as halogen atoms (e.g., chloro, homo, and fluoro), cyano groups, amine, carboxyl, amino groups, alkyl groups (e.g., 1 to 6 carbon atoms), alkoxy groups (e.g., of 1 to 6 carbon atoms) and the like.

p-Aminophenols are preferred. Preferably the aminophenols have a central nucleus of the formula:

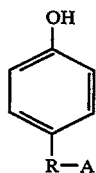

and more preferably a central nucleus of the formula

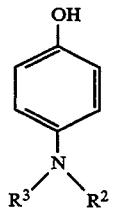

In addition to aminophenol compounds of the present invention, the alkaline activating solution may also contain water soluble alkali metal hydroxides, such as sodium or potassium hydroxide; a toning or complexing agent such as a mercaptotetrazole, mercaptothiazole or a mercaptothiazoline; a silver halide solvent such as thiocyanate or thiosulphate, electron transfer agents such as 1-phenyl-3-pyrazolidone and an antioxidant such as sodium or potassium sulfite. Other additives may include development accelerators such as polyoxyalkylenes or quaternary ammonium salts, antifoggants such as potassium bromide or iodide and thickening agents such as carboxymethylcellulose.

In the present invention a single sheet construction of a support, on which an antihalation layer, an emulsion layer and finally a physical nucleating receptor layers are provided. Developing agents may be incorporated into any layer of this construction, though preferably in the antihalation layer. Following imagewise exposure it is processed in a diffusion-transfer alkaline activator. The exposed area develops out as a black silver image, while the unexposed silver halide subsequently diffuses through to the receptor element. The physical developing nuclei in the receptor layer reduces the silver halide to a metallic silver complex in the presence of a toning agent.

The following non-limiting examples further illustrate this invention.

EXAMPLE 1

An alkaline activator was prepared as follows:

| Deionized water, purged with nitrogen @ 1 cfm for 2 hours: 90.09% | |
|---|---|
| Potassium sulfite | 5.38% |
| Sodium hydroxide | 2.85% |
| Sodium thiocyanate | 1.50% |
| Benzotriazole | 0.14% |
| 1-phenyl-5-mercaptotetrazole | 0.016% |
| Potassium iodide | 0.02% |

Batches of activator were spiked with $9.9 \times 10^{-3}$ molar levels of the following developing agents:

| Developer | % by wt. |
|---|---|
| Hydroquinone | 0.100 |
| Catechol | 0.100 |
| Resorcinol | 0.100 |
| Metol[1] | 0.313 |
| Amidol[2] | 0.179 |
| p-Aminophenol | 0.991 |
| 4-hydroxyphenylglycine | 0.152 |
| [1] 4-(methylamino)phenol sulfate | |
| [2] 2,4-diaminophenol dihydrochloride | |

A lithographic printing plate was prepared by coating on a clear gel subbed 4 mil polyester support: an underlayer consisting of an aqueous carbon black dispersion in deionized inert ossein gelatin, containing hydroquinone, phenidone, silica and formaldehyde; a photosensitive layer consisting of a ruthenium/iridium doped 75:25% silver chlorobromide emulsion sensitized to 633 nm. having an average grain size of 0.3 microns and coated at 0.7 g/m² of silver; a physical development nucleating layer containing a palladium sol, a dialdehyde starch and various coating aids.

Samples were exposed through a 0-3 density continuous tone wedge from a 633 nm/2 mw laser sensitometer. The samples were then processed in one of the above chemistries in the Kodak D65C @82° F. for 25 seconds, followed by 25 seconds in 3M Onyx ™ stabilizer and then a water wash. Sensitometric response was measured on a computerized reflection densitometer. Speed 1 and speed 2 values listed below were measured at 0.2 and 0.8 of Δdensity above Dmin respectively. Contrast values were taken as the gradient between these two speed points.

| Sample | Dmin | Dmax | Speed 1 | Speed 2 | Contrast |
|---|---|---|---|---|---|
| Control | 0.57 | 1.34 | 0.09 | −0.35 | 1.04 |
| Hydroquinone | 0.53 | 1.36 | 0.05 | −0.35 | 1.24 |
| Catechol | 0.56 | 1.33 | 0.02 | −0.32 | 1.34 |
| Resorcinol | 0.56 | 1.32 | 0.11 | −0.32 | 1.07 |
| Metol | 0.54 | 1.31 | 0.01 | −0.28 | 1.56 |
| Amidol | 0.54 | 1.30 | 0.00 | −0.34 | 1.37 |
| p-Aminophenol | 0.54 | 1.36 | 0.07 | −0.28 | 1.31 |
| 4-hydroxyphenyl-glycine | 0.48 | 1.31 | 0.07 | −0.29 | 1.38 |

Press evaluations of contact exposed material were made on a Heidelberg GTO offset press with reverse blanket using a black oil based ink. Transmission densities listed below were averaged from five readings measured on a Macbeth densitometer.

| Sample | Transfer Density | Background Density | ΔDensity |
|---|---|---|---|
| Control | 2.17 | 2.07 | 0.12 |
| Hydroquinone | 2.68 | 2.09 | 0.59 |
| Catechol | 2.32 | 2.10 | 0.22 |
| Resorcinol | 2.10 | 2.05 | 0.05 |
| Metol | 2.59 | 2.10 | 0.49 |
| Amidol | 2.52 | 2.12 | 0.40 |
| p-aminophenol | 2.54 | 2.07 | 0.47 |
| 4-hydroxyphenylglycine | 2.49 | 2.10 | 0.39 |

Except for catechol and resorcinol, roll-up and reverse blanket press tests did not reveal any significant differences in performance between these samples. The control did not roll-up. This demonstrates that aminophenols are suitable alternatives to p-dihydroxybenzenes for spiking Onyx-II activator.

Developers can readily oxidize, causing color changes and eventually resulting in the precipitation of humic acid salts. The following studies compared aminophenols to dihydroxybenzenes with respect to such changes.

EXAMPLE 2

Stress testing of spiked chemistries to oxidation was performed by aerating 500 grams of $9.9 \times 10^{-3}$ molar hydroquinone, p-aminophenol, metol and amidol activators in gas scrubber bottles @725 cc./min. for 7 days at room temperature. Sodium hydroxide solution was added to compensate for evaporation and carbon dioxide absorption during the aeration process. The resulting precipitates were filtered through tared sintered glass filters, dried overnight at 50° C. and reweighed.

| Sample | Wt. of Precipitate (g) |
|---|---|
| Control | None |
| Hydroquinone | 0.1360 |
| p-aminophenol | 0.1163 |
| Metol | 0.1428 |
| Amidol | 0.0562 |

This demonstrates that the weight of precipitate is independent of the molecular weight of the developing agent. While amidol produced the least amount of precipitate, the intense red color it generates makes it less favorable compared to the magenta to yellow color of p-aminophenol or amber color of hydroquinone.

EXAMPLE 3

Chemistry depletion studies had shown that the precipitate, a complex sodium-potassium salt of humic acid, was related to the rate of developer oxidation via the mono- and disulfonates. 500 grams of hydroquinone and p-aminophenol spiked activators were aerated at 950 cc./min. for 10 days, after which the precipitates were filtered, dried and weighed.

| Activator | Wt. of Precipitate (g) |
|---|---|
| 0.1% hydroquinone | 0.2190 |
| 0.1% p-aminophenol | 0.1941 |

Compared to Example 2, increasing oxidation increases the level of precipitation.

EXAMPLE 4

At a coating wt. of 0.4 g/m² hydroquinone, processing 1 ft.²/gallon of plate material will contribute approximately 0.01 g/L hydroquinone to the activator solution. To determine the effect of developer concentration on precipitation, 0.05–0.20% of hydroquinone and p-aminophenol were aerated for 7 days @725 cc./min.

During real time use other processes would be occurring during oxidation, e.g., generation of hydroxide ions, carbon dioxide absorption and evaporation. In this series no adjustments were made to compensate for changes in volume or pH.

| Activator | Wt. of Precipitate (g) |
|---|---|
| 0.05% hydroquinone | 0.1262 |
| 0.10% hydroquinone | 0.1598 |
| 0.20% hydroquinone | 0.1969 |
| 0.05% p-aminophenol | 0.0500 |
| 0.10% p-aminophenol | 0.1035 |
| 0.20% p-aminophenol | 0.1329 |

Since precipitation is a function of developer oxidation, aminophenols presumably form more stable intermediates, i.e., they can prolong the life of a spiked activator.

EXAMPLE 5

To confirm that the amount of precipitate is related to the rate of developer oxidation, samples of 0.1% hydroquinone and 0.1% p-aminophenol spiked activator were aerated @725 cc./min. for up to 7 days. HPLC peak areas corresponding to original developer, monosulfonate and disulfonate oxidized species are listed below.

| Days | HPLC PEAK AREAS | Mono-sulfonate | Disul-fonate | PMT | Benzo-triazole |
|---|---|---|---|---|---|
| 0.1% Hydroquinone Activator | | | | | |
| | Hydroquinone | | | | |
| Control | 11,200 | 10,050 | 1,806 | 21,450 | 319,600 |
| 1 | 0 | 0 | 365,400 | 20,920 | 318,800 |
| 2 | 0 | 0 | 391,000 | 21,560 | 325,500 |
| 3 | 0 | 0 | 400,000 | 21,080 | 319,300 |
| 5 | 0 | 0 | 404,000 | 21,970 | 333,200 |
| 7 | 0 | 0 | 373,400 | 20,470 | 313,500 |
| 0.1% p-Aminophenol Activator | | | | | |
| | p-Aminophenol | | | | |
| Control | 38,570 | 0 | 0 | 21,270 | 315,500 |
| 1 | 0 | 15,580 | 8,216 | 21,580 | 320,300 |
| 2 | 0 | 9,516 | 34,330 | 21,840 | 326,700 |
| 3 | 0 | 8,156 | 63,240 | 22,040 | 340,000 |
| 5 | 0 | 3,669 | 107,200 | 21,070 | 317,000 |
| 7 | 0 | <1,000 | 113,000 | 20,120 | 299,300 |

Since the monosulfonate species is still an active developer, the p-aminophenol will retain its spiking ability long after hydroquinone has been fully oxidized to non-developing hydroquinone disulfonate. Aminophenol is not only less susceptible to oxidation than hydroquinone, the monosulfonate species is probably a more active developer than hydroquinone monosulfonate[3].

[3] T. H. James, Theory of Photographic Chemistry, 4th Ed., p.315, 1977.

EXAMPLE 6

The experiments above accelerated the oxidation of spiked activator in order to mimic a worse case scenario. In situations where there is minimal oxidation, such as a partially full container or a reasonably air-tight replenisher tank, color changes will precede any precipitation. Aesthetically this is also undesirable and may be viewed by a customer as deterioration of the activator. While it is well known that aminophenol readily changes from a clear to magenta to yellow color in alkaline solution, the following example illustrates a lower rate of color change compared to hydroquinone under minimal oxygen conditions.

150 gram samples of 0.05, 0.10 and 0.20% p-aminophenol and hydroquinone were prepared as per Example 4. The activators were added to 250 ml. plastic beakers, with a floating cover of approximately 4 mm smaller diameter than the beaker rested on the surface, followed by parafilm covering around 95% of the top of the beaker. This arrangement sought to imitate a typical processor replenisher tank. The samples were run on a spectrophotometer, using 1 cm. cells and a developer-free activator control, over a one month period. Absorbances @400, 420, 460 and 500 nm are tabulated below.

| Day | % Developer | Absorbance 400 nm | 420 nm | 460 nm | 500 nm |
|---|---|---|---|---|---|
| Hydroquinone | | | | | |
| 0 | 0.05 | 0.03 | 0.02 | 0.01 | 0.01 |
| 1 | 0.05 | 0.08 | 0.04 | 0.02 | 0.01 |
| 3 | 0.05 | 0.12 | 0.04 | 0.01 | 0.01 |
| 7 | 0.05 | 0.53 | 0.16 | 0.04 | 0.01 |
| 10 | 0.05 | 0.86 | 0.20 | 0.04 | 0.01 |
| 15 | 0.05 | 1.40 | 0.29 | 0.08 | 0.01 |
| 23 | 0.05 | 1.75 | 0.32 | 0.09 | 0.02 |
| 32 | 0.05 | 2.80 | 0.40 | 0.10 | 0.05 |
| 0 | 0.10 | 0.03 | 0.03 | 0.03 | 0.03 |
| 1 | 0.10 | 0.12 | 0.06 | 0.02 | 0.01 |
| 3 | 0.10 | 0.18 | 0.07 | 0.03 | 0.02 |
| 7 | 0.10 | 0.80 | 0.25 | 0.07 | 0.04 |
| 10 | 0.10 | 1.50 | 0.38 | 0.09 | 0.02 |
| 15 | 0.10 | 2.09 | 0.48 | 0.15 | 0.09 |
| 23 | 0.10 | 2.70 | 0.50 | 0.12 | 0.08 |
| 32 | 0.10 | 3.50 | 0.60 | 0.19 | 0.10 |
| 0 | 0.20 | 0.03 | 0.02 | 0.02 | 0.01 |
| 1 | 0.20 | 0.16 | 0.09 | 0.03 | 0.02 |
| 3 | 0.20 | 0.29 | 0.13 | 0.10 | 0.04 |
| 7 | 0.20 | 0.60 | 0.22 | 0.09 | 0.04 |
| 10 | 0.20 | 1.04 | 0.32 | 0.10 | 0.06 |
| 15 | 0.20 | 1.95 | 0.50 | 0.16 | 0.09 |
| 23 | 0.20 | 2.85 | 0.60 | 0.20 | 0.15 |
| 32 | 0.20 | 3.35 | 0.60 | 0.20 | 0.17 |
| 60 | 0.20 | — | 0.88 | 0.31 | 0.17 |
| p-Aminophenol | | | | | |
| 0 | 0.05 | 0.01 | 0.01 | 0.00 | 0.00 |
| 1 | 0.05 | 0.00 | 0.00 | 0.00 | 0.00 |
| 4 | 0.05 | 0.01 | 0.01 | 0.01 | 0.01 |
| 7 | 0.05 | 0.01 | 0.01 | 0.01 | 0.01 |
| 12 | 0.05 | 0.01 | 0.01 | 0.01 | 0.01 |
| 20 | 0.05 | 0.01 | 0.01 | 0.01 | 0.01 |
| 29 | 0.05 | 0.17 | 0.03 | 0.01 | 0.01 |
| 0 | 0.10 | 0.01 | 0.01 | 0.00 | 0.00 |
| 1 | 0.10 | 0.00 | 0.00 | 0.00 | 0.00 |
| 4 | 0.10 | 0.01 | 0.01 | 0.01 | 0.01 |
| 7 | 0.10 | 0.04 | 0.02 | 0.02 | 0.02 |
| 12 | 0.10 | 0.05 | 0.02 | 0.01 | 0.01 |
| 20 | 0.10 | 0.10 | 0.05 | 0.02 | 0.02 |
| 29 | 0.10 | 0.19 | 0.08 | 0.04 | 0.03 |
| 0 | 0.20 | 0.02 | 0.01 | 0.00 | 0.00 |
| 1 | 0.20 | 0.01 | 0.00 | 0.00 | 0.00 |
| 4 | 0.20 | 0.02 | 0.03 | 0.03 | 0.04 |
| 7 | 0.20 | 0.02 | 0.02 | 0.03 | 0.03 |
| 12 | 0.20 | 0.04 | 0.03 | 0.03 | 0.03 |
| 20 | 0.20 | 0.09 | 0.04 | 0.03 | 0.03 |
| 29 | 0.20 | 0.13 | 0.06 | 0.03 | 0.05 |
| 57[4] | 0.20 | 0.26 | 0.14 | 0.07 | 0.09 |

[4] Between 520–540 nm absorbance = 0.10

The examples above have demonstrated that small quantities of aminophenols in an alkaline activator eliminates developer mottle and low transfer density of a diffusion-transfer processed lithographic plate. The examples have further shown advantages over p-dihydroxybenzenes in terms of significantly reduced precipitation and more stable photographically active intermediates.

EXAMPLE 7

A plate construction similar to that in Example 1 was incubated for 4 days at 40° C. prior to applying the palladium sol top coat. Exposures were made on the 633 nm laser sensitometer for sensitometric response and a Linotronic L330 imagesetter for press evaluations. Samples were then processed as per the method given in Example 1, in activators containing $9.9 \times 10^{-3}$ molar levels of the following developing agents:

| Developer | % by wt. |
|---|---|
| Hydroquinone | 0.100 |
| 2-Aminophenol | 0.991 |
| 3-Aminophenol | 0.991 |
| 4-Aminophenol hydrochloride | 0.132 |
| 2-Amino-4-chlorophenol | 0.131 |
| 4-aminobenzoic acid | 0.125 |
| 4-Amino-m-cresol | 0.112 |
| 5-aminosalicylic acid | 0.139 |

Sensitometric and printing press responses were evaluated as described previously:

| Sample | Dmin | Dmax | Speed 1 | Speed 2 | Contrast |
|---|---|---|---|---|---|
| Control | 0.63 | 1.32 | 1.67 | 1.36 | 1.33 |
| Hydroquinone | 0.55 | 1.33 | 1.68 | 1.38 | 1.58 |
| 2-Aminophenol | 0.59 | 1.34 | 1.67 | 1.37 | 1.50 |
| 3-Aminophenol | 0.62 | 1.33 | 1.68 | 1.37 | 1.39 |
| 4-Aminophenol hydrochloride | 0.57 | 1.34 | 1.70 | 1.40 | 1.55 |
| 2-Amino-4-chlorophenol | 0.59 | 1.32 | 1.70 | 1.36 | 1.32 |
| 4-Aminobenzoic acid | 0.63 | 1.33 | 1.69 | 1.37 | 1.31 |
| 4-Amino-m-cresol | 0.56 | 1.35 | 1.68 | 1.38 | 1.62 |
| 5-Aminosalicylic acid | 0.58 | 1.30 | 1.67 | 1.38 | 1.46 |

Higher Δtransmission density values are related to less toning and, to some extent, indicate how long the plate will run on press. Press wear values based on a subjective scale 1–5, 1 being the best. Little difference in roll-up was observed within this series.

| Sample | ΔDensity | Press Wear |
|---|---|---|
| Control | 0.33 | 3 |
| Hydroquinone | 0.49 | 2 |
| 2-Aminophenol | 0.45 | 3.5 |
| 3-Aminophenol | 0.35 | 3 |
| 4-Aminophenol hydrochloride | 0.46 | 2.5 |

-continued

| Sample | ΔDensity | Press Wear |
| --- | --- | --- |
| 2-Amino-4-chlorophenol | 0.38 | 2 |
| 4-Aminobenzoic acid | 0.32 | 2.5 |
| 4-Amino-m-cresol | 0.54 | 1.5 |
| 5-Aminosalicylic acid | 0.53 | 2.5 |

With respect to sensitometric response and press data, all but 3-aminophenol and 4-aminobenzoic acid offer advantages over the control. In particular, 4-amino-m-cresol with its low press wear, low Dmin and high contrast and maximum Δdensity is a significant improvement. The small difference in speed in comparision to the Control may have been due to changes in the densitometer parameters and incubating the plate prior to coating.

What I claim is:

1. A method of making a lithographic printing plate that comprises of:
   (a) imagewise exposing a light sensitive material comprising of a support, at least a negative working light sensitive silver halide layer and a surface physical development nucleating layer, said material containing a silver halide black-and-white photographic developing agent and an electron transfer agent in one or more layers;
   (b) processing said printing plate in a diffusion-transfer alkaline activator solution to provide a transferred oleophilic silver complex and a non-transferred black image in the nucleating layer;
   (c) said diffusion-transfer alkaline activator comprising at least one compound of the following structure:

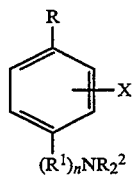

where R is a hydrogen, hydroxy or amine group,
$R^1$ is a methine group,
n is zero or one,
$R^2$ is hydrogen, a lower alkyl, alkoxy, or. carboxyl, and X is one or more of hydrogen, amine, hydroxy, lower alkyl, lower alkoxy or carboxyl groups.

2. The method of claim 1 wherein said at least one compound comprises p-aminophenol, metol or amidol.

3. The method of claim 1 wherein at least one compound is present in the range of 0.05 to 0.5% by weight.

4. The method of claim 1 wherein the developing agent is hydroquinone.

5. The method of claim 1 wherein in addition to said at least one compound there is 1-phenyl-3-pyrazolidone.

6. A method of making a lithographic printing plate that comprises the steps of:
   (a) imagewise exposing a light sensitive material comprising of a support, at least a negative working light sensitive silver halide layer and a surface physical development nucleating layer, said material containing a silver halide black-and-white photographic developing agent and an electron transfer agent in one or more layers;
   (b) processing said printing plate in a diffusion-transfer alkaline activator solution to provide a transferred oleophilic silver complex and a non-transferred black image in the nucleating layer;
   (c) said diffusion-transfer alkaline activator comprising at least one compound having a central nucleus of the formula:

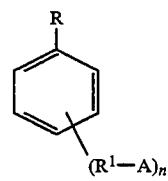

wherein R is hydrogen, hydroxy, or an amine group,
$R^1$ is a bond,

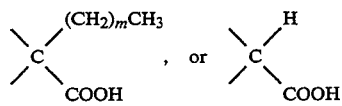

A is

m is 0, 1, 2 or 3
n is 1, 2 or 3 and
$R^2$ and $R^3$ are independently selected from alkyl, aryl, H, alkoxy, or carboxyl.

* * * * *

UNITED STATES PATENT AND TRADEMARK OFFICE
CERTIFICATE OF CORRECTION

PATENT NO. :     5,368,980
DATED      :
                 November 29, 1994
INVENTOR(S) :
                 Davies It is certified that error appears in the above-indentified patent and that said Letters Patent is hereby corrected as shown below:

Column 3, line 63, delete "2,6694,637"
and insert --2,694,637 --.

Signed and Sealed this

Seventh Day of March, 1995

Attest:

BRUCE LEHMAN

Attesting Officer       Commissioner of Patents and Trademarks